United States Patent [19]

Wakana

[11] Patent Number: 5,023,932
[45] Date of Patent: Jun. 11, 1991

[54] RADIO COMMUNICATION SYSTEM COMPRISING A PORTABLE UNIT CARRYING OUT A BATTERY SAVING OPERATION RELATED TO A SCANNING OPERATION OF A FIXED UNIT

[75] Inventor: Akira Wakana, Tokyo, Japan

[73] Assignee: NEC Corporation, Tokyo, Japan

[21] Appl. No.: 373,593

[22] Filed: Jun. 30, 1989

Related U.S. Application Data

[63] Continuation of Ser. No. 217,108, Jul. 11, 1988, abandoned, which is a continuation of Ser. No. 762,892, Aug. 6, 1985, abandoned.

[30] Foreign Application Priority Data

Aug. 7, 1984 [JP] Japan .................................. 49-164261

[51] Int. Cl.$^5$ ............................................... H04B 1/16
[52] U.S. Cl. ....................................... 455/34; 455/161; 455/343; 379/61
[58] Field of Search ....................... 455/32, 34, 54, 73, 455/76, 77, 343, 62, 161; 379/61, 63; 340/825.44

[56] References Cited

U.S. PATENT DOCUMENTS 4,328,581  5/1982  Harmon et al. ........................ 455/32
4,419,765 12/1983  Wycoff et al. ........................ 455/343
4,449,248  5/1984  Leslie et al. .......................... 455/343
4,562,307 12/1985  Bursztejn et al. .................... 455/343

Primary Examiner—Curtis Kuntz
Attorney, Agent, or Firm—Sughrue, Mion, Zinn, Macpeak & Seas

[57] ABSTRACT

In a radio communication system comprising a fixed unit (10) carrying out a first scanning operation at a channel scanning period in a waiting state and a portable unit (11) intermittently put in a waiting state thereof into active and inactive for active and inactive durations, respectively, the portable unit comprises a power source circuit (30) for rendering a sum of the active and the inactive durations equal to the channel scanning period. In each active state, a frequency synthesizer (39) carries out a second scanning operation to successively scan the radio channels one by one in cooperation with the controller (38) to detect whether or not each of the radio channels is idle. The second scanning operation may proceed either in the same order as the first scanning operation or in a reverse order relative to the first scanning operation. Alternatively, the second scanning operation may be carried out in a phase different from the first scanning operation. In this event, either one of the fixed and the portable units that is delayed in phase may skip from an actual channel to an additional one.

12 Claims, 4 Drawing Sheets

RADIO COMMUNICATION SYSTEM COMPRISING A PORTABLE UNIT CARRYING OUT A BATTERY SAVING OPERATION RELATED TO A SCANNING OPERATION OF A FIXED UNIT

This is a continuation of application Ser. No. 07/217,108, filed July 11, 1988 abandoned, which is a continuation of application Ser. No. 06/762,892, filed Aug. 6, 1985 abandoned.

BACKGROUND OF THE INVENTION

This invention relates to a radio communication system comprising a fixed unit connected to an exchange through a subscriber line and a portable unit, such as a cordless telephone set, communicable with the fixed unit through a plurality of radio channels.

In a conventional radio communication system of the type described, a small number of radio channels, for example, eight radio channels are assigned to communication between a portable unit and a fixed unit. In addition, the portable unit is driven by a battery and is repeatedly and intermittently put into an active state and an inactive one so as to save power consumption of the battery. Such an intermittent operation will be called a battery saving operation. The battery saving operation is interrupted either when the portable unit goes off-hook or when a call is received from the fixed unit. Anyway, an idle one of the radio channels must be searched and seized prior to the communication. Therefore, a radio signal is transmitted between the fixed and the portable units through a seized one of the radio channels.

Seizure of the idle radio channel can comparatively rapidly be carried out when a small number of the radio channels are used between the fixed and the portable units. However, unfavorable channel interference often takes place when the portable unit is close to another portable unit.

It is a recent trend that radio channels have increased in number to forty or so. However, an increase of the radio channels brings about lengthening a time of seizing an idle one of the radio channels.

The time of seizure might be reduced if scanning operation of the radio channels is carried out independently of each of the fixed and the portable units. According to the inventor's experimental studies, it takes as long as a few seconds to seize the idle channel even on carrying out the scanning operation. This is because the scanning operation is started after occurrence of a telephone call.

SUMMARY OF THE INVENTION

It is an object of this invention to provide a radio communication system which is capable of shortening a time of seizing an idle channel even when radio channels are increased in number.

It is another object of this invention to provide a radio communication system of the type described, wherein a scanning operation can favorably be carried out in a portable and a fixed unit to search and rapidly seize the idle channel.

A radio communication system to which this invention is applicable comprises a fixed unit and a portable unit communicable with the fixed station through a plurality of radio channels. The fixed unit is for carrying out a first scanning operation to successively and repeatedly scan the radio channels one at a time at every channel scanning period. The portable unit is repeatedly put into an active and an inactive state for an active and an inactive duration, respectively. According to this invention, the portable unit comprises duration determining means for determining lengths of the active and the inactive durations in consideration of the channel scanning period, and power source means coupled to the duration determining means for producing electric power only for the active duration to put the portable unit into the active state.

DESCRIPTION OF THE PREFERRED EMBODIMENTS

Figure 1:
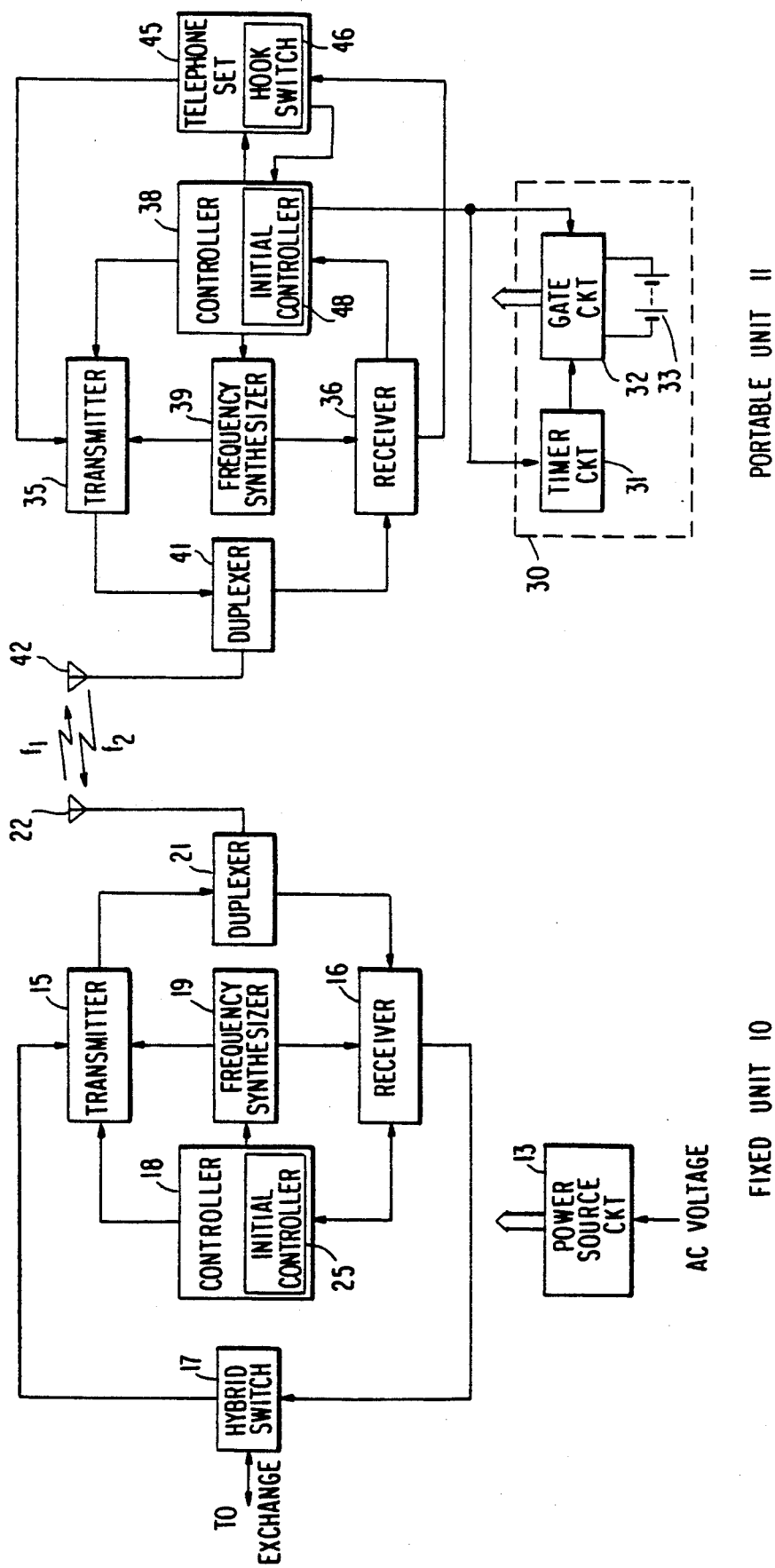
FIG. 1 is a block diagram of a radio communication system to which this invention is applicable.

Referring to FIG. 1, a radio communication system according to this invention comprises a fixed unit 10 and a portable unit 11, such as a cordless telephone set, communicable with the fixed unit 10 through a plurality of radio channels which are, for example, forty in number. Each of the radio channels has a down channel and an up channel corresponding to the down channel. The down channels and the up channels are laid within frequency bands of, for example, 959 MHz and 914 MHz, respectively, and specified by $f_1$ and $f_2$, respectively, in FIG. 1. Each down channel and the corresponding up channel will collectively be called a radio channel.

The illustrated fixed unit 10 is connected to an exchange (not shown) through a subscriber line in a known manner and comprises a power source circuit 13 supplied with an a.c. voltage so long as a power source switch (not shown) is not turned off. In the meanwhile, the power source circuit 13 is always put into an active state and delivers a d.c. voltage to various elements of the fixed unit 10 in a well-known manner.

A transmitter 15 and a receiver 16 are coupled through a hybrid switch 17 to the exchange to carry out transmission and reception operations, respectively, under control of a controller 18.

The controller 18 furthermore controls a frequency synthesizer 19 coupled to the transmitter 15 and the receiver 16. The transmitter 15 and the receiver 16 are coupled through a duplexer 21 to an antenna 22. The transmitter 15, the receiver 16, the controller 18, and the frequency synthesizer 19 may be called a fixed unit transmitter, a fixed unit receiver, a fixed unit controller, and a fixed unit frequency synthesizer, respectively.

In the example being illustrated, the fixed unit 10 is operable in a waiting or standby mode as long as no radio channel is seized. The waiting mode is for successively scanning the first through fortieth up channels to detect an idle one of the radio channels by monitoring the up channels ($f_2$) of the respective radio channels. In addition, the fixed unit 10 is put into an operation mode in a known manner after the idle channel is seized in response to a telephone call by the fixed unit 10. Such an operation mode will therefore not be described any longer.

The fixed unit controller 18 comprises an initial controller 25 for successively producing in the waiting mode a set of control signals. Responsive to the control signals, the frequency synthesizer 19 supplies the receiver 16 with a succession of local frequency signals which are varied from one to another. The receiver 16 successively selects each of the up channels in response to the first frequency signals. As a result, the frequency synthesizer 19 carries out a first scanning operation of the up channels to successively and repeatedly scan or indicate the up channels one at a time. The first scanning operation is repeated at every channel scanning period of, for example, one second and lasts until an idle one of the radio channels is seized after reception of a telephone call.

Supplied with the local frequency signals, the receiver 16 successively measures a field intensity of each up channel in the waiting mode to detect whether or not each radio channel is idle. For this purpose, the receiver 16 comprises a measuring circuit and/or a squelch circuit for measuring the field intensity of each up channel.

In FIG. 1, the portable unit 11 is also operable in a waiting mode similar to that of the fixed unit 10 until an idle one of the radio channels is seized after occurrence of a telephone call. Thereafter, a normal operation is carried out after seizure of the idle channel in a known manner.

In the waiting mode, the portable unit 11 carries out a battery saving operation. To this end, the portable unit 11 comprises a power supply circuit 30 comprising, in turn, a timer circuit 31, a gate circuit 32 coupled to the timer circuit 31, and a battery 33 coupled to the gate circuit 32.

The timer circuit 31 supplies the gate circuit 32 with a succession of gate pulses each of which defines an active duration and an inactive duration of the portable unit 11. Each gate pulse therefore appears for the active duration and disappears for the inactive duration. The active and the inactive durations are determined in consideration of the channel scanning period carried out in the fixed unit 10 in the waiting mode. Specifically, the active and the inactive durations are selected so that a sum of the active and the inactive durations becomes substantially equal to the channel scanning period.

As a result, a d.c. source voltage is delivered through the gate circuit 32 from the battery 33 to other elements of the portable unit 11 only in the presence of each gate pulse to put the portable unit 11 into an active state. No d.c. source voltage is produced in the absence of the gate pulses. The portable unit 11 is therefore put into an inactive state in the absence of the gate pulses.

Thus, the power supply circuit 30 intermittently and repeatedly puts the portable unit 11 in the waiting state thereof into the active and the inactive states and serves to save power consumption of the battery 33. The power source circuit 30 may therefore be referred to as a battery saver circuit operated in relation to the channel scanning period of the fixed unit 10.

The timer circuit 31 thus serves to determine lengths of the active and the inactive durations and will be called a duration determining circuit while a combination of the gate circuit 32 and the battery 33 is operable to produce the d.c. source voltage only for the active duration and will be called a source circuit.

The illustrated portable unit 11 further comprises a transmitter 35, a receiver 36, a controller 38, a frequency synthesizer 39, a duplexer 41, and an antenna 42, which correspond to those of the fixed unit 10, respectively. In addition, a telephone set 45 is coupled to the transmitter 35 and the receiver 36. The telephone set 45 comprises a hook switch 46 well known in the art. After the hook switch 46 goes off-hook, the telephone set 45 is supplied from the receiver 36 with a speech signal in the form of a demodulated signal and sends another speech signal to the transmitter 35 as a modulated signal.

It is to be noted here that the illustrated portable unit 11 carries out a scanning operation which is for successively scanning the down channels ($f_1$) in the waiting mode of the portable unit 11 in a manner to be described later and which will be referred to as a second scanning operation. To this end, the controller 38 comprises an initial controller 48 for supplying the frequency synthesizer 39 with a set of scanning control signals indicative of the down channels to be monitored. Responsive to the scanning control signals, the frequency synthesizer 39 carries out the second scanning operation by successively delivering a frequency signal corresponding to each of the down channels to the receiver 36. The receiver 36 successively indicates each down channel to measure a field intensity of each down channel.

Anyway, the second scanning operation lasts as long as the d.c. source voltage is given from the battery 33 to the controller 38 and to the frequency synthesizer 39. In other words, the second scanning operation is carried out only in the active state of the portable unit 11.

Thus, the second scanning operation is related to the battery saving operation in the illustrated portable unit 11. In addition, the second scanning operation is repeated at the channel scanning period in the waiting state of the portable unit 11, as will later become clear.

The first and the second scanning operations are carried out in the fixed and the portable units 10 and 11 in the waiting modes thereof, respectively. Under the circumstances, it is assumed that the hook switch 46 of the telephone set 45 goes off-hook and the controller 38 detects the off-hook. In this event, the waiting mode lasts until detection of an idle one of the radio channels. In the illustrated radio communication system, the idle channel is quickly detected because the radio channels are previously scanned prior to each normal operation in the fixed and the portable units 10 and 11. When the idle radio channel is detected and seized, the controller 38 stops scanning the radio channels and makes the transmitter 35 produce an identification signal ID through an up channel ($f_2$) of the idle radio channel. The identification signal ID carries a channel number representative of the number assigned to the idle radio channel as a channel number and is sent through the antenna 42 in the form of a frequency modulated signal.

The identification signal ID is received by the fixed unit receiver 16 and detected by the fixed unit controller 18. The fixed unit controller 18 discriminates the channel number with reference to the identification signal ID and locks the fixed unit transmitter and receiver 15 and 16 to the idle channel indicated by the channel number. Thus, the portable unit 11 is coupled to the fixed unit 10 through the radio channel composed of the up and the down channels.

Thereafter, the telephone set 45 is manipulated to produce a directory number by a subscriber. The directory number is sent from the telephone set 45 through the transmitter 35 to the fixed unit 10 and is transmitted through the subscriber line to the exchange.

When a telephone call arrives at the fixed unit 10 from the exchange, the fixed unit 10 seizes an idle one of the radio channels composed of selected down and up channels and produces a channel number signal representative of the idle radio channel through the selected down channel. Thereafter, the portable unit 11 is locked to the idle radio channel in a manner similar to that described in conjunction with the fixed unit 10. In this event, the d.c. voltage is always delivered to the elements of the portable unit 11 through the gate circuit 32. Thus, the gate circuit 32 is controlled by the controller 38.

Figure 2:
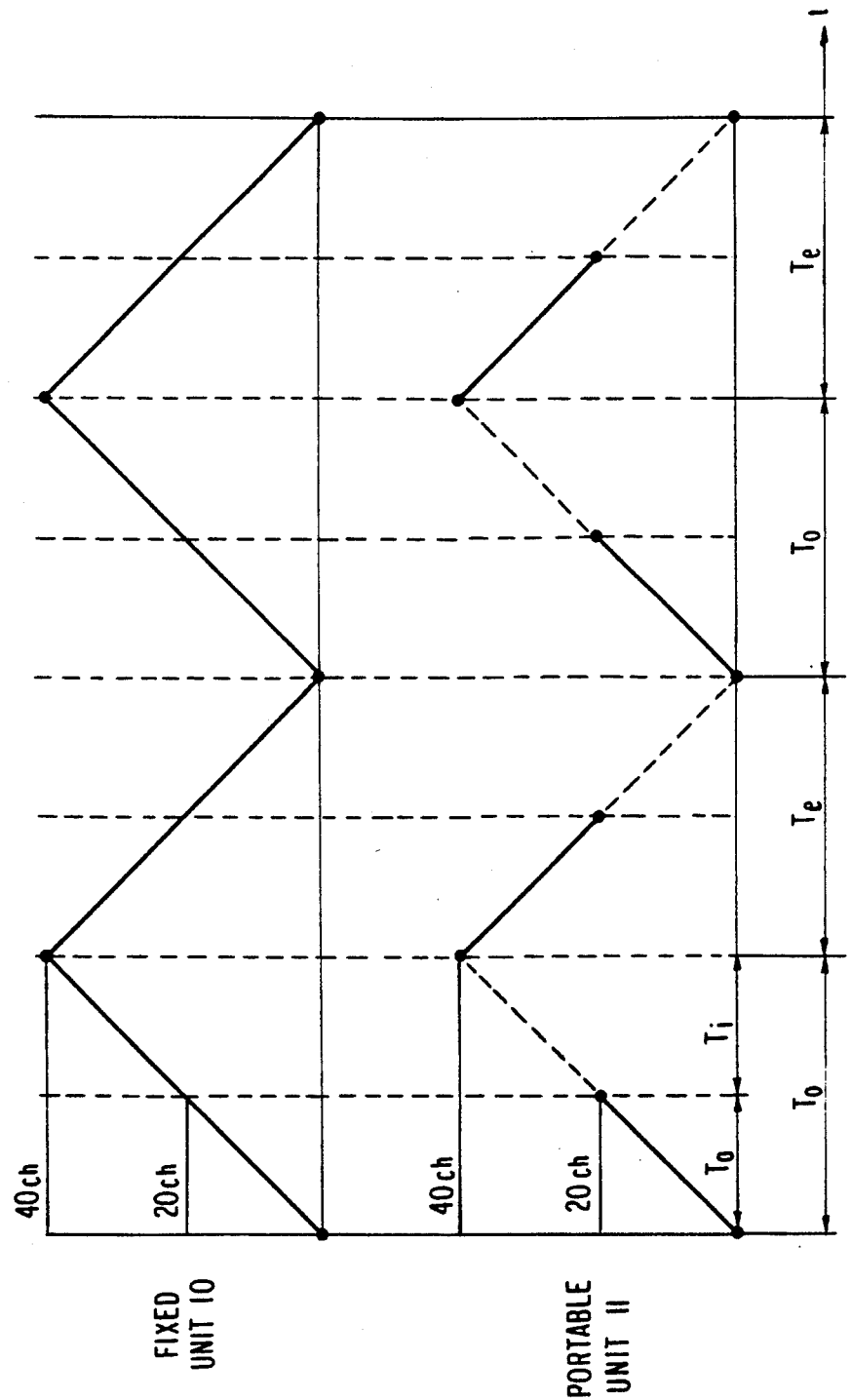
FIG. 2 is a time chart for use in describing operation of a radio communication system according to a first embodiment of this invention.

Referring to FIG. 2 together with FIG. 1, a radio communication system according to a first embodiment of this invention comprises a fixed unit 10 and a portable unit 11, which carry out the first and the second scanning operations in the waiting states. More particularly, the first scanning operation of the fixed unit 10 is repeated at the channel scanning period a succession of which is divided into odd-numbered periods $T_o$ and even-numbered ones $T_e$. The fixed unit 10 successively scans the first through fortieth channels in an ascending order during each of the odd-numbered periods $T_o$. On the other hand, the first through fortieth channels are continuously scanned in a descending order during each of the even-numbered periods $T_e$. Such scanning operation is readily possible by the use of the fixed unit frequency synthesizer 19 and the fixed unit controller 18 (FIG. 1). Specifically, the fixed unit controller 18 may supply the fixed unit frequency synthesizer 19 with the control signals in a predetermined order during each odd-numbered period $T_o$ and in a reverse order during each even-numbered period $T_e$.

The portable unit 11 is repeatedly put into the active state and the inactive state by the power supply circuit 30 (FIG. 1) which last for the active duration and the inactive duration depicted at $T_a$ and $T_i$, respectively. As shown in FIG. 2, each of the active and the inactive durations $T_a$ and $T_i$ is equal in length to a half of the channel scanning period $T_o$ or $T_e$. Thus, the sum of the active and the inactive durations $T_a$ and $T_i$ becomes equal to the channel scanning period of the fixed unit 10. Such control of the active and the inactive durations $T_a$ and $T_i$ is readily possible by adjusting the timer circuit 31 (FIG. 1).

In the portable unit 11, the second scanning operation is carried out within the active durations $T_a$. In the example being illustrated, the first through twentieth channels are successively scanned for each active duration $T_a$ in the odd-numbered periods $T_o$ in the ascending order. The twenty-first channel through fortieth channels are scanned for each active duration $T_a$ in the even-numbered periods in the descending order.

The above-mentioned second scanning operation is possible by supplying the frequency synthesizer 39 with the control signals representative of the respective radio channels, and by opening the gate circuit 32 only during the inactive duration $T_a$ under control of the controller 38.

With this structure, it is possible not only to readily detect and seize an idle radio channel on occurrence of a telephone call but also to favorably save power consumption of the battery 33 in the waiting mode of the portable unit 11.

Figure 3:
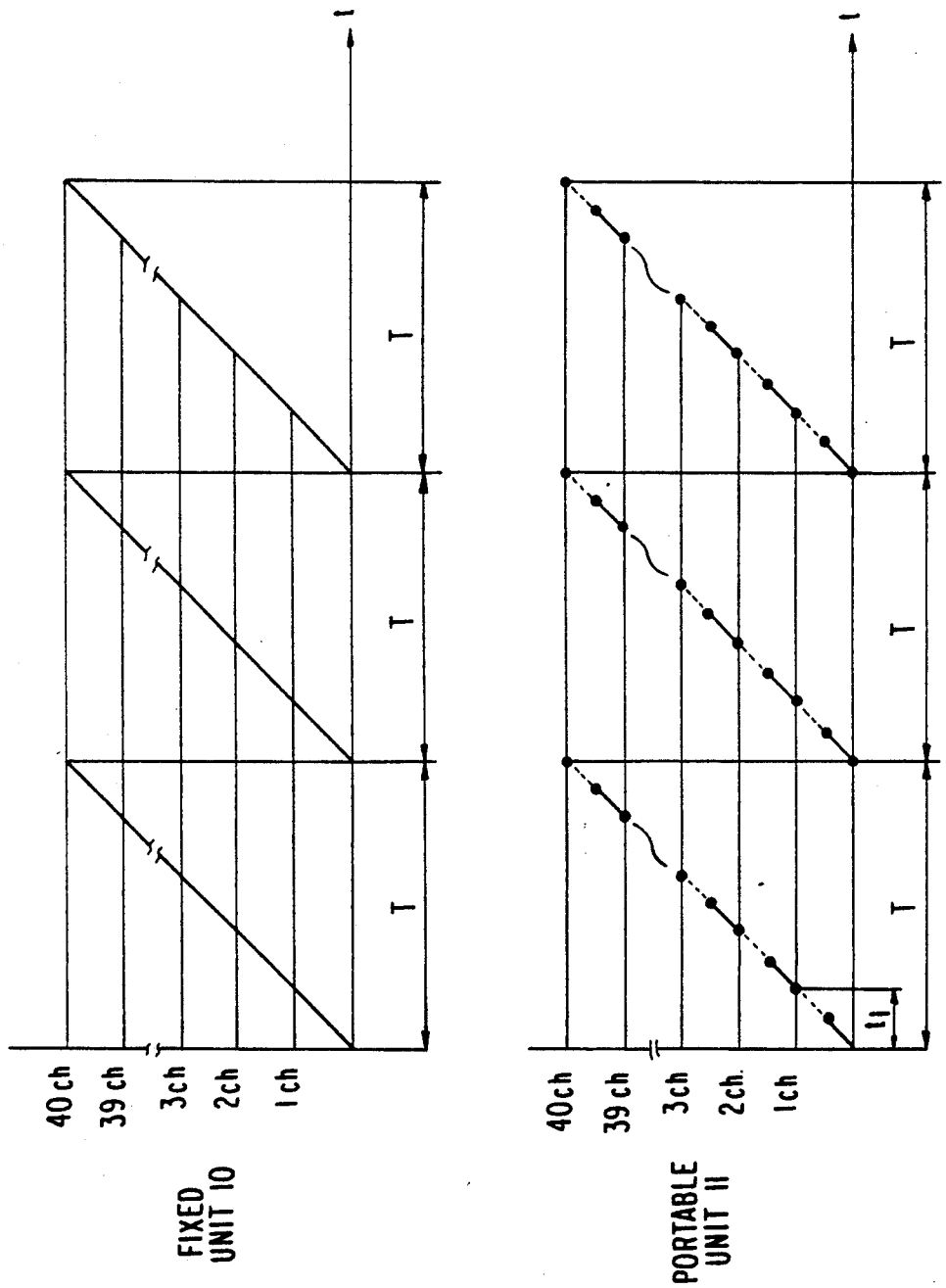
FIG. 3 is a time chart for use in describing operation of a radio communication system according to a second embodiment of this invention.

Referring to FIG. 3 together with FIG. 1, a radio communication system according to a second embodiment of this invention comprises a fixed unit 10 and a portable unit 11 which are operated in a manner illustrated in FIG. 3. As shown in FIG. 3, the fixed unit 10 successively scans the first through fortieth channels in the ascending order from the first channel during each channel scanning period depicted at T. Thus, the fixed unit 10 repeats the same channel scanning operation at every channel scanning period T.

It is mentioned here in the manner depicted for the portable unit 11 that each channel scanning period T is divisible into a plurality of partial scanning times $t_1$ which are equal in number to forty for the respective radio channels and that each partial scanning time $t_1$ is also divisible into two parts depicted by a solid and a dotted line. In the example being illustrated, the portable unit 11 is put in the waiting state into the active and the inactive states for a preceding one of the two parts and a succeeding one thereof in each partial scanning time $t_1$, respectively. Thus, the preceding and the succeeding parts define the active and the inactive durations, respectively. Like in FIG. 2, the sum of the active and the inactive durations for the first through fortieth channels becomes equal to the channel scanning period T.

The portable unit 11 carries out the second scanning operation to scan the first through the fortieth channels from the first channel in the ascending order for the preceding parts of the partial scanning times $t_1$ in each channel scanning period T. It is readily possible to accomplish the above-mentioned second scanning operation in the portable unit 11 by selecting the timer circuit 31 (FIG. 1). Therefore, description will not be made about the timer circuit 31.

The second scanning operation may be carried out from the fortieth channel in the descending order.

Figure 4:
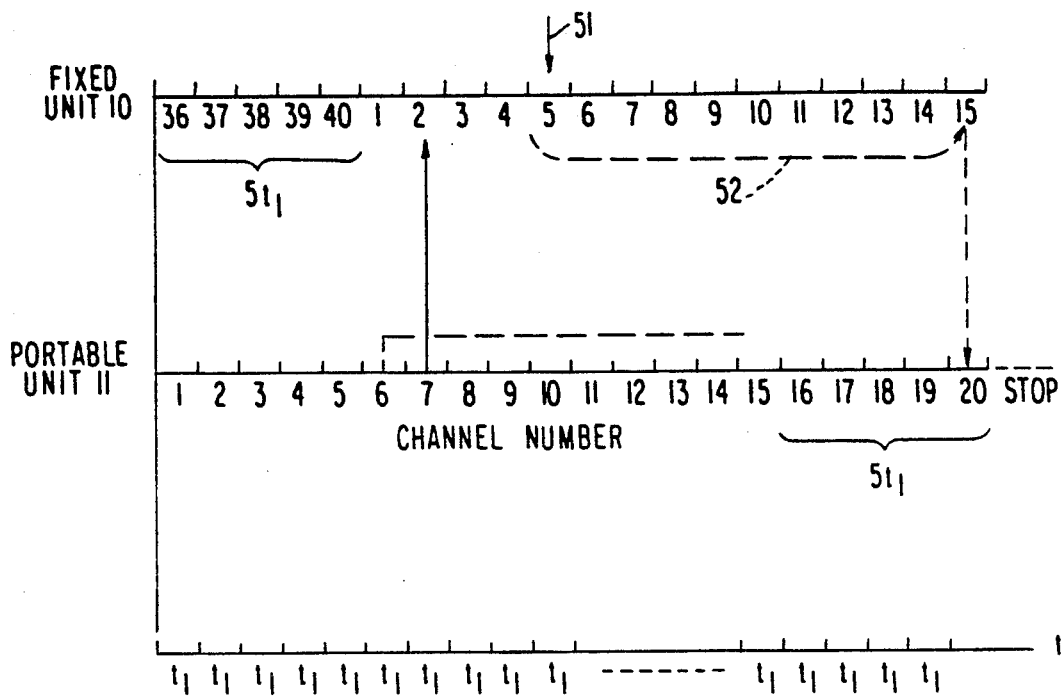
FIG. 4 is a time chart for use in describing operation of a radio communication system according to a third embodiment of this invention.

Referring to FIG. 4, a radio communication according to a third embodiment of this invention comprises a fixed unit 10 and a portable unit 11 which carry out the first and the second scanning operations in a manner to be presently described. The portable unit 11 successively scans the first through twentieth channels in the ascending order for each partial scanning time $t_1$ which will be called a unit time, as shown by channel numbers 1 through 20 in FIG. 4. Such a second scanning operation is carried out in the manner described in FIG. 2 in the active state for each channel scanning period of the fixed unit 10 and lasts during the waiting state of the portable unit 11. Anyway, the sum of the active and the inactive durations is equal to the channel scanning period, although the inactive duration is not shown in FIG. 4. As a result, twenty channels are scanned in each channel scanning period in the portable unit 11.

On the other hand, the fixed unit 10 carries out the first scanning operation which is delayed relative to the second scanning operation by five unit times, as illustrated in FIG. 4. In other words, each of the first and the second scanning operations has a scanning phase different from each other. For simplicity of description, the scanning phase of the first scanning operation will be named a first phase while the scanning phase of the second scanning operation will be named a second phase. The second phase precedes the first phase by the five unit times ($5t_1$). The first and the second phases may be therefore called a delayed and a preceding phase, respectively.

Let the hook switch 46 go off-hook when the sixth channel (6) is scanned in the portable unit 11, as shown by a broken line in FIG. 4. If the seventh channel (7) is idle, the second scanning operation is stopped at the seventh channel (7). Thus, the portable unit 11 seizes the seventh channel (7) to produce the identification signal ID through an up channel ($f_2$) of the seventh channel (7). The identification signal ID lasts until reception of acknowledgement given from the fixed unit 10. In the illustrated example, the identification signal ID is given to the fixed unit 10 at a time instant at which the second channel (2) is scanned in the fixed unit 10. The fixed unit 10 does not receive the identification signal ID before the seventh channel (7) is scanned in the fixed unit 10.

However, the identification signal ID can be received while the seventh channel (7) is scanned in the fixed unit 10. The fixed unit 10 seizes a down channel of the seventh channel (7) and sends the acknowledgement to the portable unit 11 through the down channel of the seventh channel (7). This means that the fixed unit 10 can detect and seize an idle channel when the five unit times lapse after the portable unit 11 produces the identification signal ID.

On the other hand, let a telephone call appear at the fixed unit 10 through the subscriber line from the exchange. The telephone call is assumed to arrive at a time instant at which the fifth channel (5) is scanned in the fixed unit 10, as indicated at an arrowhead 51 in FIG. 4. Inasmuch as the fixed unit 10 is operated in the delayed phase relative to the portable unit 11 as mentioned before, the fifth channel is already scanned in the portable unit 11 on arrival of the identification signal ID given from the fixed unit 10. The following scanning of the fifth channel (5) must be delayed until every second channel scanning period.

Taking the above into consideration, the first scanning operation skips from the fifth channel (5) in the ascending order by a predetermined number of the radio channels that is greater than a phase difference between the second and the first phases which are specified by the channel numbers. The fifth channel (5) may be called an actual channel. In the example being illustrated, the phase difference is equal to five unit times ($5t_1$) and the predetermined number is equal to ten. Consequently, the fifth channel (5), namely, the actual channel is automatically changed to a fifteenth channel (15) if the fifteenth channel (15) is idle, as suggested by a broken line 52 in FIG. 4. The fifteenth channel (15) may be called an additional channel. Such a skip operation is readily possible under control of the fixed unit controller 18 (FIG. 1). The identification signal ID is therefore sent through the fifteenth channel (15) from the fixed unit 10 to the portable unit 11 at a time instant at which the fifth channel (5) is to be scanned in the fixed unit 10. Accordingly, the first scanning operation is stopped at the fifteenth channel (15) when the fifth channel (5) is to be selected.

As a result, the portable unit 11 can receive the identification signal ID sent through the down channel of the fifteenth channel (15) when the portable unit 11 scans the fifteenth channel in the portable unit 11. This suggests that the identification signal ID is received through the fifteenth channel (15) by the portable unit 11 when the five unit times lapse after production of the identification signal ID (FIG. 4). Thus, the portable unit 11 receives the identification signal I.D when the fifteenth channel (15) is scanned in the portable unit 11.

Similar operation is possible when the first phase of the fixed unit 10 precedes the second phase of the portable unit 11. Anyway, it is possible for the radio communication system to shorten a time for seizing the idle channel in the fixed unit 10 and the portable unit 11.

Figure 5:
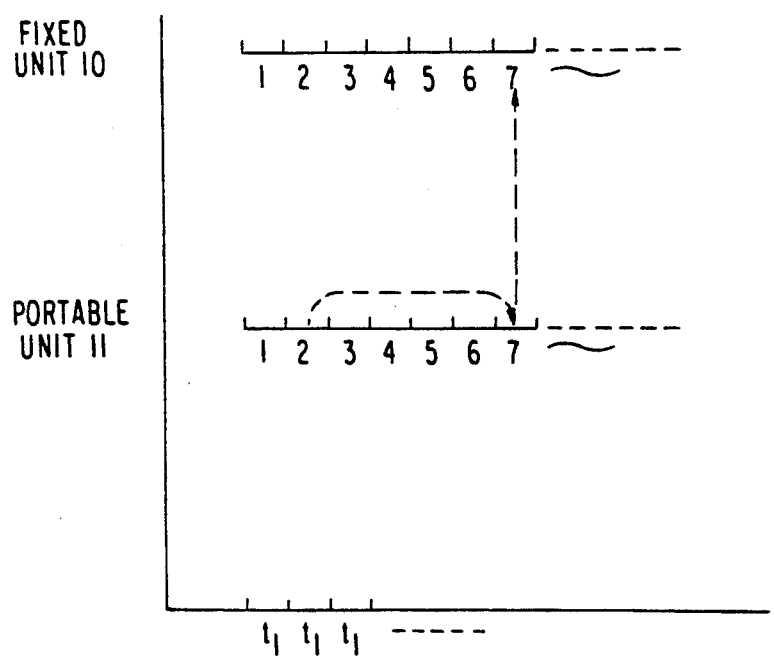
FIG. 5 is a time chart for use in describing operation of a radio communication system according to a modification of the third embodiment illustrated in FIG. 4.

Referring to FIG. 5, a skip operation of the channels is carried out even when no phase difference is present between the first and the second scanning operations. For example, let the hook switch 46 (FIG. 1) go off-hook when the second channel (2) is scanned in the portable unit 11. In this event, the portable unit 11 sends the identification signal ID through an additional channel which is the seventh channel (7) in the example illustrated in FIG. 5. The identification signal ID may carry the channel number representative of the seventh channel. As a result, the identification signal ID is received by the fixed unit 10 when the seventh channel is scanned in the fixed unit 10. Similar skip operation is carried out in the fixed unit 10 to assure seizure of a radio channel between the fixed unit 10 and the portable unit 11.

In FIGS. 2 through 5, the first scanning operation should be carried out in synchronism with the second scanning operation. In order to establish synchronization between the first and the second scanning operations, a channel synchronization signal may be superposed on an on-hook signal which is produced from the hook switch 46 when a conversation is finished. The channel synchronization signal is delivered to the controller 38 and to the fixed unit controller 18. Responsive to the channel synchronization signal, each of the controllers 38 and 18 is put into an initial state and thereafter starts each scanning operation. In the portable unit 11 (FIG. 1), the channel synchronization signal is sent to the timer circuit 31 to put the same into an initial state. Thus, scanning operations successively proceed in the waiting states of the fixed unit 10 and the portable unit 11 in synchronism with each other.

While this invention has thus far been described in conjunction with several embodiments thereof, it will readily be possible for those skilled in the art to put this invention into practice in various other manners. For example, either one of the first and the second scanning operations illustrated in FIG. 2 may be performed in a reverse or descending order relative to the other operation. This serves to quickly search an idle one of the radio channels.

What is claimed is:

1. In a radio communication system comprising a fixed unit and a portable unit communicable with said fixed station through a plurality of radio channels, said fixed unit carrying out a first scanning operation to successively and repeatedly scan all of said radio channels one at a time every channel scanning period, said portable unit being repeatedly put into an active and an inactive state for an active and an inactive duration, respectively, the improvement wherein said portable unit comprises:

duration determining means for determining lengths of said active and said inactive durations, said duration determining means operating in synchronism with said first scanning operation; and power source means coupled to said duration determining means for producing electric power to said portable unit only for said active duration to put said portable unit into said active state.

2. A radio communication system as claimed in claim 1, wherein a sum of said active and said inactive durations is substantially equal to said channel scanning period.

3. A radio communication system as claimed in claim 2, wherein said portable unit comprises:
portable unit scanning means repeatedly energized by said power source means for carrying out a second scanning operation to successively scan said radio channels one by one for said active duration and, thereby, to detect whether or not each of said radio channels is idle.

4. A radio communication system as claimed in claim 3, said radio channels being consecutively numbered from a first one of said radio channels to a last one thereof, wherein:
said first scanning operation is carried out by successively selecting said first through last channels one by one in a predetermined order for each channel scanning period in a first phase;
said second scanning operation being carried out by successively selecting said first through last channels one by one in said predetermined order for said active duration in a second phase different from said first phase.

5. A radio communication system as claimed in claim 4, wherein said first phase is delayed relative to said second phase by a predetermined number of said radio channels.

6. A radio communication system as claimed in claim 5, said fixed unit seizing a current one of said radio channels, wherein said first scanning operation skips from said current one of said radio channels in said predetermined order to an additional one of said radio channels that is spaced apart from said current one of said radio channels at least by said predetermined number of said radio channels.

7. A radio communication system as claimed in claim 4, wherein said first phase precedes said second phase by a predetermined number of said radio channels.

8. A radio communication system as claimed in claim 7, said portable unit seizing a current one of said radio channels, wherein said second scanning operation skips from said current one of said radio channels in said predetermined order to an additional one of said radio channels that is spaced apart from said current one of said radio channels at least by said predetermined number of said radio channels.

9. A radio communication system as claimed in claim 3, said radio channels being consecutively numbered from a first one of said radio channels to a last one thereof, wherein:
said first scanning operation is carried out by successively selecting said first through last channels one by one in a predetermined order for each channel scanning period;
said second scanning operation being carried out by successively selecting said first through last channels one by one for said active duration in an order which is reversed relative to said predetermined order.

10. A radio communication system as claimed in claim 3, said radio channels being consecutively numbered from a first one of said radio channels to a last one thereof, wherein:
said first scanning operation is carried out by successively selecting said first through last channels one by one in a predetermined order for each channel scanning period;
said second scanning operation being carried out by successively selecting said first through last channels one by one in said predetermined order for said active duration.

11. A radio communication system as claimed in claim 10, each of said fixed and said portable units seizing a current one of said radio channels, wherein each of said first and said second scanning operations is carried out by skipping from said current one of said radio channels by a prescribed number of said radio channels in said predetermined order.

12. A radio communication system as claimed in claim 3, said portable unit comprising a hook switch which manually goes off-hook and on-hook, wherein a synchronization signal is produced in said portable unit when said hook switch goes on-hook; and
said synchronization signal is transmitted to said portable unit scanning means and said fixed unit to synchronize said second scanning operation with said first scanning operation.

* * * * *

UNITED STATES PATENT AND TRADEMARK OFFICE
CERTIFICATE OF CORRECTION

PATENT NO. : 5,023,932

DATED : June 11, 1991

INVENTOR(S) : Akira Wakana

It is certified that error appears in the above-identified patent and that said Letters Patent is hereby corrected as shown below:

On the Title page

Foreign Application Priority Data delete "49" and insert --59--.

Signed and Sealed this

Twenty-ninth Day of December, 1992

Attest:

DOUGLAS B. COMER

*Attesting Officer*  *Acting Commissioner of Patents and Trademarks*